United States Patent
Van Melle et al.

(10) Patent No.: US 9,287,081 B2
(45) Date of Patent: Mar. 15, 2016

(54) LITHOGRAPHY SYSTEM, MODULATION DEVICE AND METHOD OF MANUFACTURING A FIBER FIXATION SUBSTRATE

(75) Inventors: Ralph Van Melle, Hellevoetsluis (NL); Teunis Van De Peut, Leusden (NL); Henk Derks, Waalre (NL)

(73) Assignee: MAPPER LITHOGRAPHY IP B.V., Delft (NL)

( * ) Notice: Subject to any disclaimer, the term of this patent is extended or adjusted under 35 U.S.C. 154(b) by 1176 days.

(21) Appl. No.: 13/281,558

(22) Filed: Oct. 26, 2011

(65) Prior Publication Data
US 2012/0145931 A1    Jun. 14, 2012

Related U.S. Application Data

(60) Provisional application No. 61/406,675, filed on Oct. 26, 2010, provisional application No. 61/479,263, filed on Apr. 26, 2011, provisional application No. 61/477,228, filed on Apr. 20, 2011.

(51) Int. Cl.
*H01J 37/04* (2006.01)
*B82Y 10/00* (2011.01)
(Continued)

(52) U.S. Cl.
CPC ............... *H01J 37/045* (2013.01); *B82Y 10/00* (2013.01); *B82Y 40/00* (2013.01); *H01J 37/22* (2013.01); *H01J 37/3174* (2013.01); *H01J 37/3177* (2013.01); *H01J 2237/0437* (2013.01)

(58) Field of Classification Search
CPC ..... H01J 37/045; H01J 37/3177; H01J 37/22; H01J 37/3174; B82Y 10/00; B82Y 40/00
See application file for complete search history.

(56) References Cited

U.S. PATENT DOCUMENTS 5,872,618 A * 2/1999 Nagayama .......... G03F 7/70058
                                                                    355/53
6,897,458 B2    5/2005 Wieland et al.
(Continued)

FOREIGN PATENT DOCUMENTS

JP    S 61 123806    11/1986
JP    2006 210460    10/2006
(Continued)

OTHER PUBLICATIONS

M. Wieland et al, "MAPPER: high throughput maskless lithography.", SPIE, PO BOX10 Bellingham WA 98227-0010 USA, vol. 7271, Mar. 17, 2009.

*Primary Examiner* — Wyatt Stoffa
(74) *Attorney, Agent, or Firm* — Hoyng Rokh Monegier LLP; David P. Owen

(57) ABSTRACT

The invention relates to a charged-particle multi-beamlet lithography system for transferring a pattern onto the surface of a target. The system comprises a beam generator for generating a plurality of charged particle beamlets, a beamlet blanker array for patterning the beamlets in accordance with a pattern, and a projection system for projecting the patterned beamlets onto the target surface. The blanker array comprises a plurality of modulators and a plurality of light sensitive elements. The light sensitive elements are arranged to receive pattern data carrying light beams and to convert the light beams into electrical signals. The light sensitive elements are electrically connected to one or more modulators for providing the received pattern data. The blanker array is coupled to a fiber fixation substrate which accommodates end sections of a plurality of fibers for providing pattern data carrying light beams as an assembled group with a fixed connection.

22 Claims, 5 Drawing Sheets

(51) Int. Cl.
 *B82Y 40/00* (2011.01)
 *H01J 37/22* (2006.01)
 *H01J 37/317* (2006.01)

(56) References Cited

U.S. PATENT DOCUMENTS

| | | | |
|---|---|---|---|
| 6,958,804 B2 | 10/2005 | Wieland et al. | |
| 7,019,908 B2 | 3/2006 | van 't Spijker | |
| 7,084,414 B2 * | 8/2006 | Wieland | B82Y 10/00 250/492.1 |
| 7,129,502 B2 | 10/2006 | Kruit | |
| 7,709,815 B2 * | 5/2010 | Jager | B82Y 10/00 250/492.1 |
| 8,921,758 B2 * | 12/2014 | Wieland et al. | 250/216 |
| 2002/0005491 A1 * | 1/2002 | Yagi | B82Y 10/00 250/396 ML |
| 2002/0145113 A1 * | 10/2002 | Sullivan | B82Y 10/00 250/311 |
| 2002/0146215 A1 | 10/2002 | Ogawa et al. | |
| 2003/0016935 A1 | 1/2003 | Nakajima | |
| 2004/0008952 A1 | 1/2004 | Kragl | |
| 2004/0051055 A1 * | 3/2004 | Kruit | B82Y 40/00 250/492.3 |
| 2004/0057671 A1 | 3/2004 | Kang et al. | |
| 2004/0135983 A1 * | 7/2004 | Wieland | B82Y 10/00 355/67 |
| 2005/0062950 A1 * | 3/2005 | van 't Spijker | B82Y 10/00 355/53 |
| 2005/0199821 A1 * | 9/2005 | Saini | B82Y 10/00 250/398 |
| 2005/0242303 A1 | 11/2005 | Platzgummer | |
| 2006/0006349 A1 * | 1/2006 | Wieland | B82Y 10/00 250/492.23 |
| 2006/0022289 A1 * | 2/2006 | Badhei | G02B 6/10 257/432 |
| 2006/0109445 A1 | 5/2006 | Walf et al. | |
| 2007/0064213 A1 * | 3/2007 | Jager | B82Y 10/00 355/67 |
| 2007/0187625 A1 * | 8/2007 | Wieland | B82Y 10/00 250/504 R |
| 2008/0061247 A1 * | 3/2008 | Wieland | B82Y 10/00 250/396 R |
| 2008/0073588 A1 * | 3/2008 | Kruit | B82Y 10/00 250/492.21 |
| 2008/0158536 A1 * | 7/2008 | Wieland | B82Y 10/00 355/67 |
| 2008/0158537 A1 * | 7/2008 | Wieland | B82Y 10/00 355/67 |
| 2009/0026912 A1 * | 1/2009 | Lordi | B82Y 10/00 313/414 |
| 2009/0268184 A1 * | 10/2009 | Lin | B82Y 10/00 355/67 |
| 2010/0142886 A1 * | 6/2010 | Warashina | G02B 6/4214 385/14 |
| 2010/0171046 A1 * | 7/2010 | Jager | B82Y 10/00 250/492.3 |
| 2010/0294955 A1 * | 11/2010 | Wang | B82Y 10/00 250/492.3 |
| 2011/0261340 A1 * | 10/2011 | Wieland | B82Y 10/00 355/67 |
| 2012/0043457 A1 * | 2/2012 | Wieland | B82Y 10/00 250/227.11 |
| 2013/0043413 A1 * | 2/2013 | De Boer | B82Y 10/00 250/492.3 |
| 2014/0057212 A1 * | 2/2014 | Ohishi | H01J 37/3007 430/325 |
| 2014/0106279 A1 * | 4/2014 | Morita | H01J 37/045 430/296 |

FOREIGN PATENT DOCUMENTS

WO WO 2007013802 A1 2/2007
WO WO 2009127659 A2 10/2009

* cited by examiner

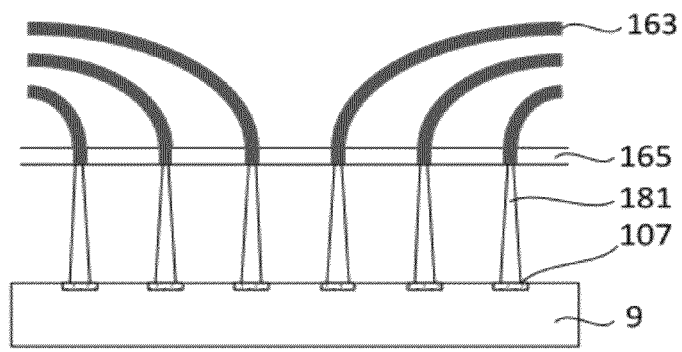
*Fig. 7*
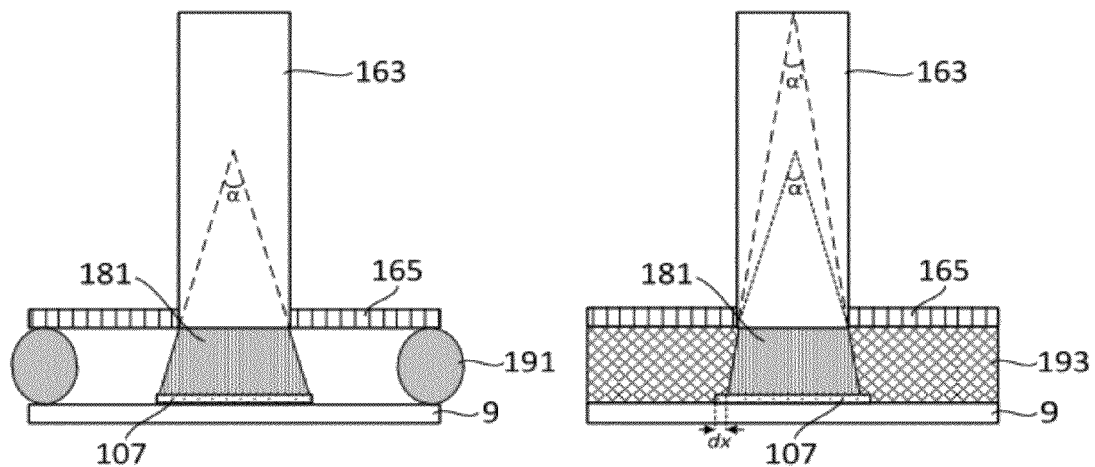
*Fig. 8A*  *Fig. 8B*

LITHOGRAPHY SYSTEM, MODULATION DEVICE AND METHOD OF MANUFACTURING A FIBER FIXATION SUBSTRATE

BACKGROUND OF THE INVENTION

1. Field of the Invention

The invention relates to a charged-particle multi-beamlet lithography system for transferring a pattern onto the surface of a target using a plurality of charged particle beamlets. The invention further relates to a modulation device for use in a charged-particle multi-beamlet lithography system. Finally, the invention relates to a method of manufacturing a fiber fixation substrate for use in such lithography system or such device.

2. Description of the Related Art

Charged particle multi-beamlet systems are known in the art, for example from U.S. Pat. No. 6,958,804 and/or from WO2009/127659, both in the name of the applicant, the latter one, being specifically adapted for very high volume throughput operation. Such lithography system uses a plurality of charged particle beamlets to transfer a pattern to a target surface. The system may operate with a continuous radiation source or with a source operating at constant frequency. Pattern data are sent to a modulation device arranged to modulate the beamlets by electrostatic deflection. The modulated beamlets are then transferred to the target surface. Generally, during this transfer the diameter of the individual beamlets is reduced. Furthermore, the position of the beamlets with respect to the target surface changes over time, for example due to electrostatic scanning of beamlets and/or movement of the target surface relative to the optical column through which the beamlets are transferred with respect to each other. For example, such relative movement may be established by mechanical movement using a stage provided with a support structure for holding the target. In order to enable a high speed transfer of the pattern to the target surface, optical transmission of pattern data from the control unit to the modulators may be used, for example by using light beams. The modulation device may then include light sensitive elements capable of converting received light signals into corresponding electric signals.

Patterning with a system as described above may suffer from inconsistent pattern transfer due to perturbated transfer of the light signals. As a result, pattern transfer onto a target surface using such system may be less reliable than desired.

BRIEF SUMMARY OF THE INVENTION

It is an object of the present invention to provide a lithography system with improved reliability without a loss of accuracy. For this purpose, the invention provides a charged-particle multi-beamlet lithography system for transferring a pattern onto the surface of a target using a plurality of charged particle beamlets, the system comprising: a beam generator for generating a plurality of charged particle beamlets; a beamlet blanker array for patterning the plurality of beamlets in accordance with a pattern; and a projection system for projecting the patterned beamlets onto the target surface; wherein the beamlet blanker array comprises a plurality of modulators and a plurality of light sensitive elements, a light sensitive element being arranged to receive pattern data carrying light beams and to convert the light beams into electrical signals, the light sensitive element being electrically connected to one or more modulators for providing the received pattern data to the one or more modulators; and wherein the beamlet blanker array is coupled to a fiber fixation substrate which accommodates the end sections of a plurality of fibers for providing the pattern data carrying light beams as an assembled group with a fixed connection.

Some embodiments of the invention relate to a modulation device for use in a charged-particle multi-beamlet lithography system, the modulation device comprising: a beamlet blanker array for patterning the plurality of beamlets in accordance with a pattern, and a fiber fixation substrate for accommodating the end sections of a plurality of fibers as an assembled group with a fixed connection; wherein the beamlet blanker array comprising a plurality of modulators and a plurality of light sensitive elements, a light sensitive element being arranged to receive pattern data carrying light beams and to convert the light beams into electrical signals, the light sensitive element being electrically connected to one or more modulators for providing the received pattern data to the one or more modulators; and wherein the fibers within the fiber fixation substrate are arranged for providing the pattern data carrying light beams.

Some embodiments of the invention relate to a method of manufacturing a fiber fixation substrate for use in a lithography system as defined above or a device as defined above, the method comprising: providing a substrate with a plurality of apertures; providing a plurality of fibers, and placing fiber ends of the plurality of fibers through the apertures; fixing the fiber ends in the apertures by using an adhesive; and polishing the fiber end surface side of the substrate.

The measures according to the present invention hence in various embodiments realizes so called alignment by design, in which light sensitive elements, for example photodiodes, and the fiber ends within the fixated fiber substrate are pre-aligned in accordance with a predetermined specification without the possibility of adjustment after the mutual coupling of the fixated fiber substrates and the blanker array, in particular a mutual coupling of a fiber end and a matching light sensitive element within a suitable area of the blanker array.

Either one or both of the beamlet blanker array and the fixated fiber substrate may be provided with one or more mutual locating elements. Examples of such location element include, but are not limited to a protrusion and a stop. Once in position, the functioning of the optical coupling between the two parts may be checked for each of the diodes before final mutual attachment is realized. After attachment, adjustment is no longer possible. As a result of this pre-attachment check, the mutual coupling of the two parts may either be accepted or rejected.

In some embodiments of the invention, the coupling of the beamlet blanker array and the fixated fiber substrate is established by the provision of an adhesive layer which serves as an optical filler between at least a fiber end and the photodiode surface. The adhesive layer preferably has a refractive index that effectively reduces the opening angle of light projected on the light sensitive element. Such filler may include a glue or alike, and may for example be a high purity type of epoxy.

BRIEF DESCRIPTION OF THE DRAWINGS

Various aspects of the invention will be further explained with reference to embodiments shown in the drawings wherein:

FIG. 7 schematically shows a more detailed view of the alignment between optical fibers within the fiber array of FIGS. 6A-6C and corresponding light sensitive elements; and FIGS. 8A, 8B schematically show two different ways of fixing a fiber array to a blanker array.

DESCRIPTION OF ILLUSTRATIVE EMBODIMENTS

The following is a description of various embodiments of the invention, given by way of example only and with reference to the figures. The figures are not drawn to scale and merely intended for illustrative purposes.

Figure 1:
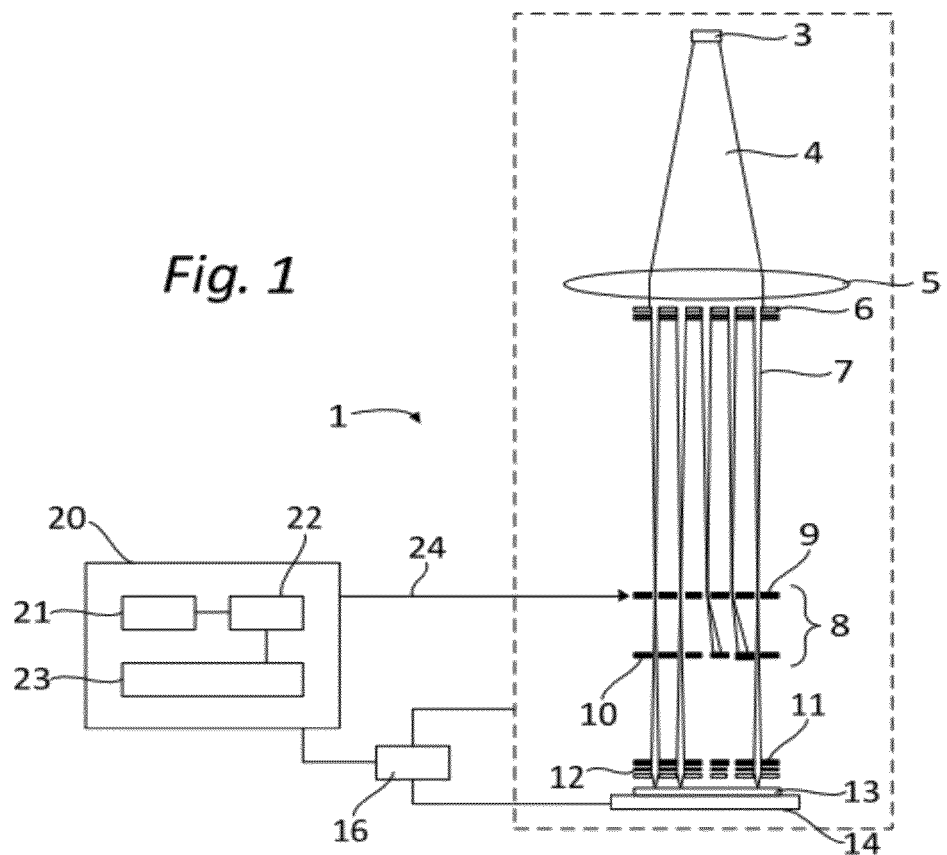
FIG. 1 schematically shows a maskless lithography system that may be used in embodiments of the inventions.

FIG. 1 shows a simplified schematic drawing of an embodiment of a charged particle multi-beamlet lithography system 1. The lithography system 1 suitably comprises a beamlet generator generating a plurality of beamlets, a beamlet modulator patterning the beamlets to form modulated beamlets, and a beamlet projector for projecting the modulated beamlets onto a surface of a target.

The beamlet generator typically comprises a source and at least one beam splitter. The source in FIG. 1 is an electron source 3 arranged to produce a substantially homogeneous, expanding electron beam 4. The beam energy of the electron beam 4 is preferably maintained relatively low in the range of about 1 to 10 keV. To achieve this, the acceleration voltage is preferably low, and the electron source 3 may be kept at a voltage between about –1 to –10 kV with respect to the target at ground potential, although other settings may also be used.

In FIG. 1 the electron beam 4 from the electron source 3 passes a collimator lens 5 for collimating the electron beam 4. The collimator lens 5 may be any type of collimating optical system. Before collimation, the electron beam 4 may pass a double octopole (not shown). Subsequently, the electron beam 4 impinges on a beam splitter, in the embodiment of FIG. 1 an aperture array 6. The aperture array 6 preferably comprises a plate having through-holes. The aperture array 6 is arranged to block part of the beam 4. Additionally, the array 6 allows a plurality of beamlets 7 to pass through so as to produce a plurality of parallel electron beamlets 7.

The lithography system 1 of FIG. 1 generates a large number of beamlets 7, preferably about 10,000 to 1,000,000 beamlets, although it is of course possible that more or less beamlets are generated. Note that other known methods may also be used to generate collimated beamlets. A second aperture array may be added in the system, so as to create subbeams from the electron beam 4 and to create electron beamlets 7 from the subbeam. This allows for manipulation of the subbeams further downstream, which turns out beneficial for the system operation, particularly when the number of beamlets in the system is 5,000 or more.

The beamlet modulator, denoted in FIG. 1 as modulation system 8, typically comprises a beamlet blanker array 9 comprising an arrangement of a plurality of blankers, and a beamlet stop array 10. The blankers are capable of deflecting one or more of the electron beamlets 7. In embodiments of the invention, the blankers are more specifically electrostatic deflectors provided with a first electrode, a second electrode and an aperture. The electrodes are then located on opposing sides of the aperture for generating an electric field across the aperture. Generally, the second electrode is a ground electrode, i.e. an electrode connected to ground potential.

To focus the electron beamlets 7 within the plane of the blanker array 9 the lithography system may further comprise a condenser lens array (not shown).

In the embodiment of FIG. 1, the beamlet stop array 10 comprises an array of apertures for allowing beamlets to pass through. The beamlet stop array 10, in its basic form, comprises a substrate provided with through-holes, typically round holes although other shapes may also be used. In some embodiments, the substrate of the beamlet stop array 10 is formed from a silicon wafer with a regularly spaced array of through-holes, and may be coated with a surface layer of a metal to prevent surface charging. In some further embodiments, the metal is of a type that does not form a native-oxide skin, such as CrMo.

The beamlet blanker array 9 and the beamlet stop array 10 operate together to block or let pass the beamlets 7. In some embodiments, the apertures of the beamlet stop array 10 are aligned with the apertures of the electrostatic deflectors in the beamlet blanker array 9. If beamlet blanker array 9 deflects a beamlet, it will not pass through the corresponding aperture in the beamlet stop array 10. Instead the beamlet will be blocked by the substrate of beamlet block array 10. If beamlet blanker array 9 does not deflect a beamlet, the beamlet will pass through the corresponding aperture in the beamlet stop array 10. In some alternative embodiments, cooperation between the beamlet blanker array 9 and the beamlet stop array 10 is such that deflection of a beamlet by a deflector in the blanker array 9 results in passage of the beamlet through the corresponding aperture in the beamlet stop array 10, while non-deflection results in blockage by the substrate of the beamlet stop array 10.

The modulation system 8 is arranged to add a pattern to the beamlets 7 on the basis of input provided by a control unit 20. The control unit 20 may comprise a data storage unit 21, a read out unit 22 and data converter 23. The control unit 20 may be located remote from the rest of the system, for instance outside the inner part of a clean room. The control system may further be connected to an actuator system 16. The actuator system is arranged for executing a relative movement of the electron-optical column represented by the dashed line in FIG. 1 and a target positioning system 14.

Modulated light beams 24 holding pattern data are transmitted to the beamlet blanker array 9 using optical fibers. More particularly, the modulated light beams 24 from optical fiber ends are projected on corresponding light sensitive elements located on the beamlet blanker array 9. The light sensitive elements may be arranged to convert the light signal into a different type of signal, for example an electric signal. A modulated light beam 24 carries a portion of the pattern data for controlling one or more blankers that are coupled to a corresponding light sensitive element. In some embodiments, the light beams may, at least partially, be transferred towards the light sensitive elements by means of an optical waveguide.

The modulated beamlets coming out of the beamlet modulator are projected as a spot onto a target surface of a target 13 by the beamlet projector. The beamlet projector typically comprises a scanning deflector for scanning the modulated beamlets over the target surface and a projection lens system for focusing the modulated beamlets onto the target surface. These components may be present within a single end module.

Such end module is preferably constructed as an insertable, replaceable unit. The end module may thus comprise a deflector array 11, and a projection lens arrangement 12. The insertable, replaceable unit may also include the beamlet stop array 10 as discussed above with reference to the beamlet modulator. After leaving the end module, the beamlets 7 impinge on a target surface positioned at a target plane. For lithography applications, the target 13 usually comprises a wafer provided with a charged-particle sensitive layer or resist layer.

The deflector array 11 may take the form of a scanning deflector array arranged to deflect each beamlet 7 that passed the beamlet stop array 10. The deflector array 11 may comprise a plurality of electrostatic deflectors enabling the application of relatively small driving voltages. Although the deflector array 11 is drawn upstream of the projection lens arrangement 12, the deflector array 11 may also be positioned between the projection lens arrangement 12 and the target surface.

The projection lens arrangement 12 is arranged to focus the beamlets 7, before or after deflection by the deflector array 11. Preferably, the focusing results a geometric spot size of about 10 to 30 nanometers in diameter. In such preferred embodiment, the projection lens arrangement 12 is preferably arranged to provide a demagnification of about 100 to 500 times, most preferably as large as possible, e.g. in the range 300 to 500 times. In this preferred embodiment, the projection lens arrangement 12 may be advantageously located close to the target surface.

In some embodiments, a beam protector (not shown) may be located between the target surface and the projection lens arrangement 12. The beam protector may be a foil or a plate provided with a plurality of suitably positioned apertures. The beam protector is arranged to absorb the released resist particles before they can reach any of the sensitive elements in the lithography system 1.

The projection lens arrangement 12 may thus ensure that the spot size of a single pixel on the target surface is correct, while the deflector array 11 may ensure by appropriate scanning operations that the position of a pixel on the target surface is correct on a microscale. Particularly, the operation of the deflector array 11 is such that a pixel fits into a grid of pixels which ultimately constitutes the pattern on the target surface. It will be understood that the macroscale positioning of the pixel on the target surface is suitably enabled by a target positioning system 14.

Commonly, the target surface comprises a resist film on top of a substrate. Portions of the resist film will be chemically modified by application of the beamlets of charged particles, i.e. electrons. As a result thereof, the irradiated portion of the film will be more or less soluble in a developer, resulting in a resist pattern on a wafer. The resist pattern on the wafer can subsequently be transferred to an underlying layer, i.e. by implementation, etching and/or deposition steps as known in the art of semiconductor manufacturing. Evidently, if the irradiation is not uniform, the resist may not be developed in a uniform manner, leading to mistakes in the pattern. High-quality projection is therefore relevant to obtain a lithography system that provides a reproducible result. No difference in irradiation ought to result from deflection steps.

Figure 2:
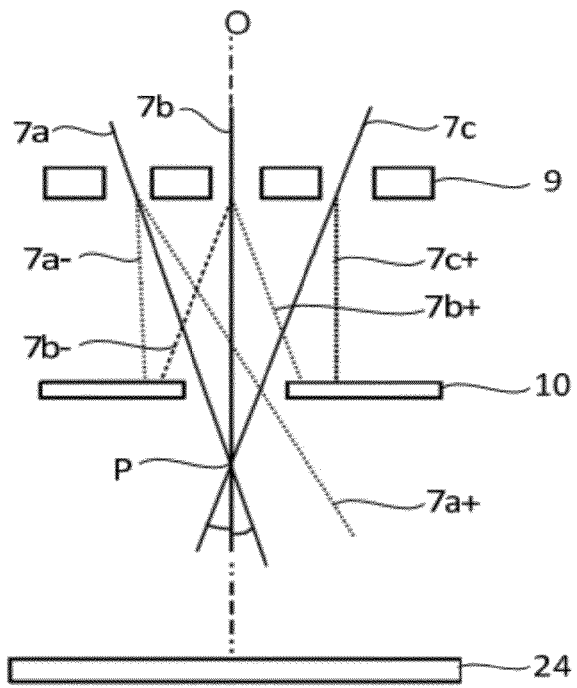
FIG. 2 schematically shows the operation of an embodiment of the beamlet blanker array in the lithography system of FIG. 1.

FIG. 2 schematically shows the operation of an embodiment of the beamlet blanker array 9 in the lithography system of FIG. 1. In particular, FIG. 2 schematically shows a cross-sectional view of a portion of a beamlet modulator comprising a beamlet blanker array 9 and beamlet stop array 10. The beamlet blanker array 9 is provided with a plurality of apertures. For sake of reference the target 13 has also been indicated. The figure is not drawn to scale.

The shown portion of the beamlet modulator is arranged to modulate three beamlets 7a, 7b, and 7c. The beamlets 7a, 7b, 7c may form part of a single group of beamlets that may be generated from a beam originating from a single source or from a single subbeam. The beamlet modulator of FIG. 2 is arranged for converging groups of beamlets towards a common point of convergence P for each group. This common point of convergence P is preferably located on an optical axis O for the group of beamlets.

Considering the shown beamlets 7a, 7b, 7c in FIG. 2, beamlets 7a, 7c have an incident angle extending between the beamlet and the optical axis O. The orientation of beamlet 7b is substantially parallel to the optical axis. The direction of beamlet deflection to establish blocking of deflected beamlets by the substrate of the beamlet stop array 10 may be different for each beamlet. Beamlet 7a is blocked by deflection towards the left, i.e. towards the "–"-direction in FIG. 2, indicated by dashed line 7a–. Beamlets 7b, 7c on the other hand are to be deflected towards the right, i.e. towards the "+"-direction, to established blocking of the respective beamlets. These blocking directions are indicated by dashed lines 7b+ and 7c+ respectively. Note that the choice of deflection direction may not be arbitrary. For example, for beamlet 7a, dashed line 7a+ shows that deflection of beamlet 7a towards the right would result in passage through the beamlet stop array 10. Therefore, deflection of beamlet 7a along line 7a+ would be inappropriate. On the other hand, deflection of beamlet 7b towards the left, indicated by dashed line 7b–, would be an option.

Figure 3:
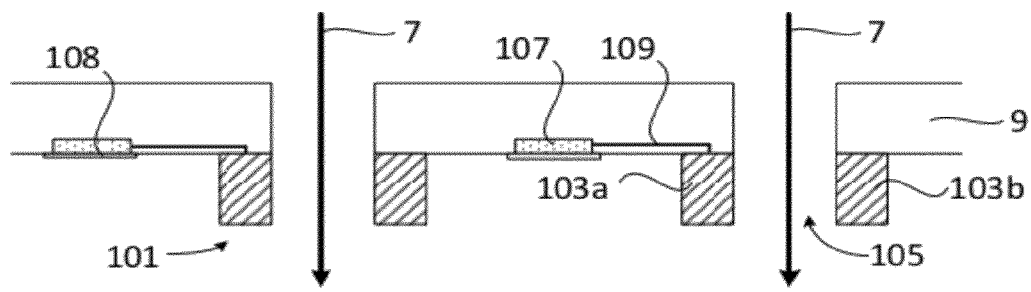
FIG. 3 schematically shows a cross-sectional view of a portion of a beamlet blanker array that may be used in the lithography system of FIG. 1.

FIG. 3 schematically shows a cross-sectional view of a portion of a beamlet blanker array 9 that may be used in the lithography system of FIG. 1. The beamlet blanker array 9 comprises a plurality of modulators 101. A modulator comprises a first electrode 103a, a second electrode 103b, and an aperture 105. The electrodes 103a, 103b are located on opposing sides of the aperture 105 for generating an electric field across the aperture.

A light sensitive element 107 is arranged to receive pattern data carrying light beams (not shown). The light sensitive element 107 is electrically connected to one or more modulators 101 via an electrical connection 109. The light sensitive element 107 receives pattern data via the light beams, converts the light signal into an electrical signal and then forwards the received and converted pattern data via the electrical connection 109 towards the one or more connected modulators 101. The one or more modulators 101 then modulate passing charged particle beamlets, such as electron beamlets 7 in accordance with the received pattern data. The light sensitive element 107 may be provided with an anti-reflection coating 108 to reduce background radiation caused by reflected light, which may disturb a correct readout of the data carried by the light beam.

Figure 4:
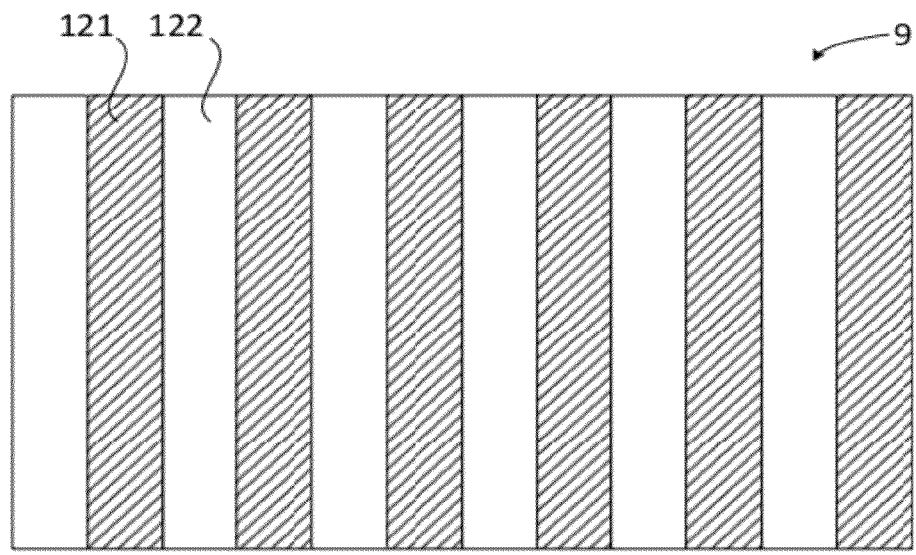
FIG. 4 schematically shows a top view of a lay-out of a beamlet blanker array that may be used in embodiments of the invention.

FIG. 4 schematically shows a top view of a lay-out of a beamlet blanker array 9 that may be used in embodiments of the invention. The beamlet blanker array 9 shown in FIG. 4 is divided into beam areas 121 and non-beam areas 122. Although the width of the beam areas 121 and non-beam areas 122 are shown to be about the same, this is not essential. The dimensions of the areas may differ based on the layout used.

The beam areas 121 include one or more modulators for modulating beamlets. The non-beam areas 122 include one or more light sensitive elements. The use of beam areas 121 and non-beam areas 122 in an optical column in a maskless lithography system has the advantage that the density of modulators and light sensitive area can be increased.

Although the beam areas 121 and the non-beam areas 122 are shown in an arrangement forming a perfect rectangle, the areas may actually form a skew arrangement to allow for an optimal projection of beamlets onto the target surface, as will be understood by a person skilled in the art.

Figure 5:
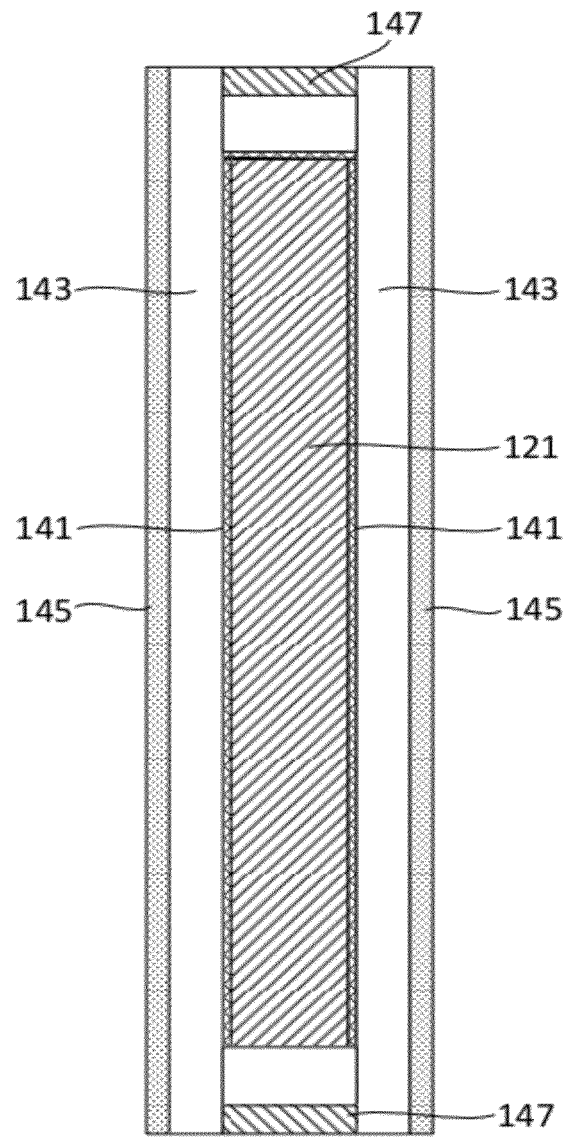
FIG. 5 schematically shows a top view of a more detailed lay-out of a beamlet blanker array that may be used in embodiments of the invention.

FIG. 5 schematically shows a top view of a more detailed lay-out of a portion of a beamlet blanker array 9 that may be used in embodiments of the invention. The blanker array portion includes a beam area 121 surrounded by an area reserved for a shielding structure 141. The beamlet blanker array 9 further includes a non-beam area, which effectively is all the space that is not reserved for the beam area 121 and the shielding structure 141. The shielding structure 141 is arranged to substantially shield electric fields that are externally generated, for example in the proximity of light sensitive elements, such as photodiodes, within the non-beam areas.

The shielding structure 141 can be described as comprising side walls forming an open-ended box-like structure. Note that the shielding structure 141 is not necessarily physically connected to the beamlet blanker array 9. If located within sufficiently close distance of the beamlet blanker array 9 the shielding structure 141 can still sufficiently shield electric fields.

Materials suitable for the shielding structure 111 are materials with sufficiently high electric conductivity. Additionally, the material should have sufficient strength and workability. An exemplary suitable material for use as main component of the shielding structure is titanium (Ti). Other exemplary materials that may be used include molybdenum (Mo) and aluminum (Al). In an exemplary embodiment, the shielding structure is made using Ti-plates coated with Mo. In another exemplary embodiment the shielding structure includes a stack of Mo sheets with Al spacers.

The beamlet blanker array portion of FIG. 5 further includes an optical interface area 143 reserved for establishing an optical interface between optical fibers arranged for carrying light signals and light sensitive elements within the beamlet blanker array 9. The light sensitive elements, such as photodiodes, are thus placed within the optical interface area 143. The optical fibers may cover the entire optical interface area 143 or a portion thereof. The optical fibers are suitably arranged so that they do not physically block electron beamlets within the beam area 121 during use of the lithography system.

Additionally, the non-beam area of the beamlet blanker array 9 includes a power interface area 145. The power interface area 145 is arranged to accommodate a power arrangement for suitably powering the light sensitive elements, and optionally other components, within the optical interface area 143. The power arrangement 145 may extend in a direction substantially perpendicular to, and away from the blanker array 9. Such arrangement 145 may enable the spread of the power lines over a large surface area, which improves the efficiency and reduces losses, e.g. due to a reduced thermal resistance caused by an increased radiation surface area.

The position of the power interface area 145 on the sides of the optical interface area 143 enables the use of relatively short power supply lines to the light sensitive elements. Consequently, the variation in voltage drop between different power lines, i.e. connections with nearby light sensitive elements versus connections with light sensitive elements further away, can be reduced.

The non-beam area may further include an additional interface area 147 to enable the accommodation of further circuitry, for example a clock and/or a control. The power arrangement within the power interface area 145 may also be arranged to provide sufficient power to the additional interface area 147.

Although FIG. 5 schematically shows a very specific layout of the several areas, it will be understood that it is possible to have a different lay-out. Similarly, the size and shape of the different interface areas may vary in dependence of the specific application.

Figure 6A:
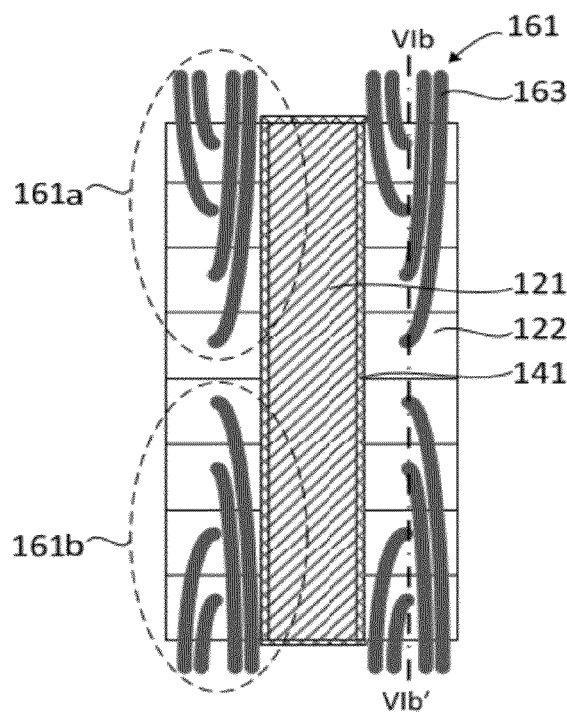
FIG. 6A schematically shows an optical fiber arrangement on top of the beamlet blanker array of FIG. 4.

FIG. 6A schematically shows an exemplary embodiment of an optical fiber arrangement 161 selectively placed over the beamlet blanker array 9 of FIG. 4. The optical fiber arrangement 161 comprises a plurality of optical fibers 163 arranged to guide pattern data carrying light beams towards the light sensitive elements within the non-beam areas 122. The fibers 163 are positioned such that they do not hinder a passage of charged particle beamlets arranged to pass through the apertures within the beam area 121 of the beamlet blanker array 9.

The exemplary optical fiber arrangement 161 of FIG. 6A comprises two portions per non-beam area 122. A first portion 161a comprises a number of fibers 163 that enter a space above the non-beam area 122 from one side, while the second portion 161b comprises a number of fibers 163 entering the space above the non-beam area 122 at an opposing side. The number of fibers 163 within each portion 161a, 161b may be equal to each other. The use of different portions allows for more space per fiber 163, and reduces the risk of damaging the fibers 163.

Alternatively, all fibers 163 may enter the space above the non-beam area 122 from one side. In such case, the other side may be used to accommodate power circuitry, for example to supply power to power lines within the power interface in the power interface area 145 in FIG. 5. Furthermore, the entry of fibers at one side may simplify maintenance operations. For example, in case of fiber replacement, only one side of the system needs to be dismantled.

Figure 6B:
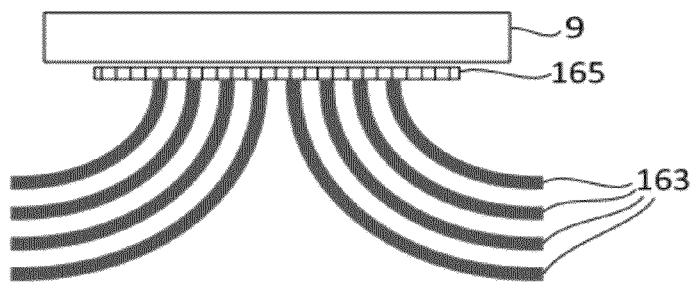
FIG. 6B schematically shows a cross-sectional view of the arrangement shown in FIG. 6A along the line VIB-VIB'.

FIG. 6B schematically shows a cross-sectional view of the arrangement shown in FIG. 6A along the line VIB-VIB'. The fibers 163 within the arrangement 161 terminate in a fiber fixation substrate 165 forming a fiber array. The ends of the fibers within the fiber fixation substrate 165 are directed towards the light sensitive elements (not shown) within the non-beam area of the beamlet blanker array 9. As will be discussed in more detail with reference to FIGS. 7, 8A and 8B, the fiber fixation substrate 165 is placed in close proximity of, and fixated to, the surface of the beamlet blanker array 9. Such position minimizes alignment errors due to poorly oriented fibers 163 within the fiber fixation substrate 165.

Figure 6C:
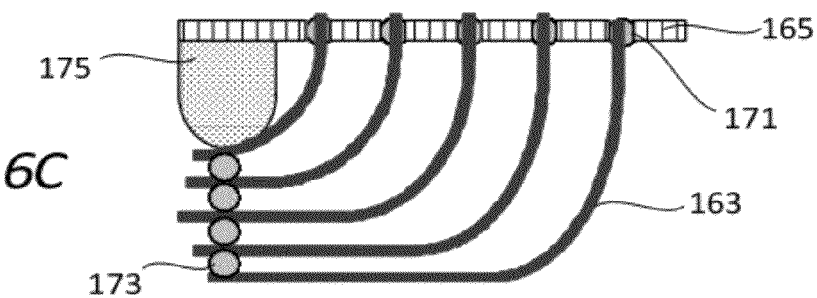
FIG. 6C schematically shows a more detailed view of the optical fiber arrangement of FIGS. 6A, 6B.

FIG. 6C schematically shows a more detailed view of an embodiment of the optical fiber arrangement of FIGS. 6A, 6B. In this embodiment, the fiber fixation substrate 165 comprises a substrate with a plurality of suitably placed apertures, for example by using semiconductor processing techniques such as etching. The fibers 163 are positioned in the apertures and fixed by using an adhesive material 171, for example suitable glue. Preferably, the height differences of the fibers 163 extending through the apertures in the fixation substrate 165 is less than 0.2 microns. This may be achieved by polishing the substrate after placement and fixing of the fibers 163.

The fibers 163 may be guided towards the apertures via a supporting unit 175. The supporting unit 175 may simplify the bending of fibers 163. Furthermore, the presence of the supporting unit 175 may avoid that defects, such as kinks, develop during the bending process. The entire arrangement of fibers 163 and substrate 165 may be strengthened even further by connecting the fibers 163 to each other, and preferably also to the supporting unit 175, for example by using an adhesive 173. The adhesive 175 used within the apertures of the substrate 165 may be the same as the adhesive 173 used to fix the fibers 163 to each other and, preferably, to the supporting unit 175. Fixing the fibers 163 into the fixation substrate 165 provides a robust fiber array which provides a reliable light output. Fixing the fibers 163 to each other, and preferably also to the supporting unit 173, if present, further improves the robustness of the design.

FIG. 7 schematically shows a more detailed view of the alignment between optical fibers 163 within the fiber fixation substrate 165 of FIGS. 6A-6C and corresponding light sensitive elements 107 within the non-beam area of the blanker array 9. The fiber fixation substrate 165 is placed in close proximity to the light sensitive elements 107, preferably at a distance smaller than about 100 microns, more preferably at a distance smaller than about 50 microns. Due to the short distance between the light sensitive elements 107 and the fiber ends, optical communication with reduced light loss can be achieved.

The alignment of the fibers 163 in the fiber fixation substrate 165 and the light sensitive elements 107 in the blanker array 9 is fixed. This can be done after an alignment procedure, which may include the use of markers, such as optical markers, on the blanker array 9. Alternatively, both the fiber fixation substrate 165 and the array of light sensitive elements 107 on the blanker array 9 are manufactured with sufficient precision that alignment of the two structures with respect to each other leads to sufficient alignment between corresponding fibers 163 and light sensitive elements 107. In case test results before actual operation of the lithography system show that a combination of a specific fiber 163 and a corresponding light sensitive element 107 does not perform according to the predetermined specifications, such combination may be excluded by the control unit during lithographic processing.

FIGS. 8A, 8B schematically show two different ways of fixing a fiber fixation substrate 165 forming a fiber array to a blanker array 9. In both Figures, only a single combination of fiber 163 and light sensitive element 107 is shown.

In FIG. 8A the fiber fixation substrate 165 is connected to the blanker array 9 by using an adhesive 191. The adhesive 191 may be a suitable glue, for example an epoxy glue. The adhesive 191 contacts the blanker array 9 such that there is no contact between the adhesive and the light sensitive element 107. This way of fixing allows for the use of small quantities of adhesive, and is easy to execute.

As also shown in FIG. 7, the light beams 181 exiting the fibers 163 diverge. As a result, the beam spot size on the surface of the blanker array 9 increases with an increase of the distance between the fiber fixation substrate 165 and the blanker array 9. Furthermore, the light intensity of the beam spot per unit area decreases. Therefore, an increase in distance reduces the amount of light that can be captured by the light sensitive element 107. Since a light sensitive element 107 needs to be capable of capturing a certain minimum amount of light for proper operation, alignment errors may have more profound effect in case the distance between the fiber fixation substrate 165 and the blanker array 9 becomes too large.

In some cases, in particular when it is not desirable to reduce the distance between the fiber and the light sensitive element, fixing is preferably done using a suitable transparent adhesive layer 193, sometimes referred to as underlay, as schematically shown in FIG. 8B. The transparent adhesive layer 193 is in contact with a large portion of both the blanker array 9 and the fiber fixation substrate 165, and may act as a filler effectively filling the gap between the blanker array 9 and the substrate 165.

Contrary to adhesive 191 shown in FIG. 8A, the adhesive layer 193 is also in contact with the light sensitive element 107. The material within the adhesive layer 193 has a sufficiently high refractive index which reduces the opening angle of the light beam 181 exiting the optical fiber 163.

The use of the adhesive layer 193 with a sufficiently high refractive index has the advantage that the alignment tolerance is improved. For example, in FIG. 8A, the light beam 181 exiting the optical fiber 163 has an opening angle $\alpha$ that is such that the light sensitive element 107 is entirely covered. However, if the alignment between the optical fiber 163 and the light sensitive element 107 is not perfect, a portion of the light will not fall onto the light sensitive element 107. Consequently, the light output received by the light sensitive element 107 readily decreases upon imperfect alignment.

In FIG. 8B, due to the presence of the adhesive layer 193 comprising a material with a sufficiently high refractive index, the opening angle of the light exiting the fiber 163 has an opening angle $\alpha'$, where $\alpha'$ is smaller than $\alpha$. The smaller opening angle reduces the spot size of the beamlet that falls onto the light sensitive element, while the light output of the spot is the same. Consequently, as schematically shown in FIG. 8B, even in case the optical fiber 163 and the light sensitive element are misaligned over a distance dx, the light sensitive element 107 still captures the entire beam 181, and the light output received by the light sensitive element merely starts to reduce if misalignment becomes greater than such distance dx. The embodiment shown in FIG. 8B is thus less susceptible to reduced performance caused by small alignment errors.

A suitable material for the adhesive layer 193 is an epoxy adhesive or glue substantially transparent to the light emitted by the fiber 163 and having a sufficiently high refractive index, for example higher than 1.4, preferably higher than about 1.5.

It will be recognized that other fixing constructions may be used as well. For example, the fiber fixation substrate 165 and the blanker array 9 may be fixed together by using connector elements such as Dowel pins.

Furthermore, at least one of the beamlet blanker array and the fixated fiber substrate may be provided with one or more mutual locating elements. Examples of such location elements include, but are not limited to a protrusion and a stop.

The invention has been described by reference to certain embodiments discussed above. It will be recognized that these embodiments are susceptible to various modifications and alternative forms well known to those of skill in the art without departing from the spirit and scope of the invention. Accordingly, although specific embodiments have been described, these are examples only and are not limiting upon the scope of the invention, which is defined in the accompanying claims.

What is claimed is:

1. A charged-particle multi-beamlet lithography system for transferring a pattern onto the surface of a target using a plurality of charged particle beamlets, the system comprising:
    a beam generator for generating a plurality of charged particle beamlets;
    a beamlet blanker array for patterning the plurality of beamlets in accordance with a pattern; and
    a projection system for projecting the patterned beamlets onto the target surface;

wherein the beamlet blanker array comprises a plurality of modulators and a plurality of light sensitive elements, a light sensitive element being arranged to receive pattern data carrying light beams and to convert the light beams into electrical signals, the light sensitive element being electrically connected to one or more modulators for providing the received pattern data to the one or more modulators;

wherein the beamlet blanker array is coupled to a fiber fixation substrate which accommodates end sections of a plurality of fibers for providing the pattern data carrying light beams as an assembled group with a fixed connection, wherein the fiber fixation substrate comprises a substrate provided with a plurality of apertures through which the end sections of fibers extend, wherein the end sections of fibers are connected to the substrate with an adhesive, and wherein a surface of the fiber fixation substrate faces a surface of the beamlet blanker array, and the apertures on the fiber fixation substrate are aligned with the light sensitive elements on the beamlet blanker array.

2. The system of claim 1, wherein the end sections of the plurality of fibers are within about 100 microns of corresponding light sensitive elements.

3. The system of claim 1, wherein the coupling between the beamlet blanker array and the fiber fixation substrate is established by an adhesive in contact with the blanker array at positions free of light sensitive elements and in contact with the fiber fixation substrate at positions free of an end section of a fiber.

4. The system of claim 1, wherein the coupling between the beamlet blanker array and the fiber fixation substrate is established by an adhesive layer.

5. The system of claim 4, wherein the adhesive layer is in contact with a portion of both the blanker array and the fiber fixation substrate.

6. The system of claim 5, wherein the adhesive layer is in contact with both the end sections of fibers in the fiber fixation substrate and the light sensitive elements provided on the beamlet blanker array.

7. The system of claim 6, wherein the adhesive layer comprises a material with a refractive index higher than about 1.4.

8. The system of claim 7, wherein the adhesive layer comprises a material with a refractive index higher than about 1.5.

9. The system of claim 1, wherein the surface of the fiber fixation substrate facing the blanker array is polished such that variation between heights of the end sections of the fibers extending through the substrate is less than about 2 microns.

10. The system of claim 1, wherein the surface of the beamlet blanker array facing the fiber fixation substrate comprises a first area comprising at least one modulator and a second area free of modulators, and wherein the coupling of the beamlet blanker array and the fiber fixation substrate is established in the second area.

11. The system of claim 1, wherein the light sensitive elements are provided with an anti-reflection coating.

12. A modulation device for use in a charged-particle multi-beamlet lithography system, the modulation device comprising:

a beamlet blanker array for patterning the plurality of beamlets in accordance with a pattern, and a fiber fixation substrate for accommodating end sections of a plurality of fibers as an assembled group with a fixed connection;

wherein the beamlet blanker array comprising a plurality of modulators and a plurality of light sensitive elements, a light sensitive element being arranged to receive pattern data carrying light beams and to convert the light beams into electrical signals, the light sensitive element being electrically connected to one or more modulators for providing the received pattern data to the one or more modulators;

wherein the fibers within the fiber fixation substrate are arranged for providing the pattern data carrying light beams, wherein the fiber fixation substrate comprises a substrate provided with a plurality of apertures through which the end sections of fibers extend, wherein the end sections of fibers are connected to the substrate with an adhesive, and wherein a surface of the fiber fixation substrate faces a surface of the beamlet blanker array, and the apertures on the fiber fixation substrate are aligned with the light sensitive elements on the beamlet blanker array.

13. The device of claim 12, wherein the end sections of the plurality of fibers are within about 100 microns of corresponding light sensitive elements.

14. The device of claim 12, wherein the coupling between the beamlet blanker array and the fiber fixation substrate is established by an adhesive in contact with the blanker array at positions free of light sensitive elements and in contact with the fiber fixation substrate at positions free of an end section of a fiber.

15. The device of claim 12, wherein the coupling between the beamlet blanker array and the fiber fixation substrate is established by an adhesive layer.

16. The device of claim 15, wherein the adhesive layer is in contact with a large portion of both the blanker array and the fiber fixation substrate.

17. The device of claim 16, wherein the adhesive layer is in contact with both the end sections of fibers in the fiber fixation substrate and the light sensitive elements provided on the beamlet blanker array.

18. The device of claim 17, wherein the adhesive layer comprises a material with a refractive index higher than about 1.4.

19. The device of claim 18, wherein the adhesive layer comprises a material with a refractive index higher than about 1.5.

20. The device of claim 12, wherein the surface of the fiber fixation substrate facing the blanker array is polished such that variation between heights of the end sections of the fibers extending through the substrate is less than about 2 microns.

21. The device of claim 12, wherein the surface of the beamlet blanker array facing the fiber fixation substrate comprises a first area comprising at least one modulator and a second area free of modulators, and wherein the coupling of the beamlet blanker array and the fiber fixation substrate is established in the second area.

22. The device of claim 12, wherein the light sensitive elements are provided with an anti-reflection coating.

* * * * *